(12) United States Patent
Heinz et al.

(10) Patent No.: US 10,746,806 B2
(45) Date of Patent: Aug. 18, 2020

(54) TRANSISTOR BRIDGE FAILURE TEST

(71) Applicant: Infineon Technologies AG, Neubiberg (DE)

(72) Inventors: Alexander Heinz, Munich (DE); Matthias Bogus, Munich (DE)

(73) Assignee: Infineon Technologies AG, Neubiberg (DE)

( * ) Notice: Subject to any disclaimer, the term of this patent is extended or adjusted under 35 U.S.C. 154(b) by 931 days.

(21) Appl. No.: 15/077,524

(22) Filed: Mar. 22, 2016

(65) Prior Publication Data
US 2017/0276715 A1   Sep. 28, 2017

(51) Int. Cl.
*G01R 31/50*   (2020.01)
*G01R 31/44*   (2020.01)
*G01R 31/42*   (2006.01)
*G01R 19/165*   (2006.01)

(52) U.S. Cl.
CPC ....... *G01R 31/50* (2020.01); *G01R 19/16528* (2013.01); *G01R 31/42* (2013.01); *G01R 31/44* (2013.01)

(58) Field of Classification Search
CPC .................. G01R 31/025; G01R 31/44; G01R 19/16528; G01R 31/42
USPC .................... 324/551, 661; 327/108; 318/278
See application file for complete search history.

(56) References Cited

U.S. PATENT DOCUMENTS

| | | | | |
|---|---|---|---|---|
| 5,838,558 A * | 11/1998 | Tan | ..................... | H02M 3/3376 363/91 |
| 7,642,913 B2 * | 1/2010 | Hayakawa | ............... | G01P 15/08 324/661 |
| 8,558,586 B1 * | 10/2013 | Martin | .................. | G11C 7/1057 327/108 |
| 8,816,614 B2 * | 8/2014 | Barth | ........................ | H02P 8/02 318/278 |
| 2008/0136627 A1 | 6/2008 | Hayakawa | | |
| 2014/0268951 A1 | 9/2014 | Wang et al. | | |
| 2015/0145553 A1 * | 5/2015 | Pasqualetto | ............ | G01R 31/40 324/764.01 |

(Continued)

FOREIGN PATENT DOCUMENTS

| | | |
|---|---|---|
| CN | 104052295 A | 9/2014 |
| CN | 105242190 A | 1/2016 |

OTHER PUBLICATIONS

Office Action, in the Chinese language, from counterpart Chinese Application No. 201710170737.1, dated Feb. 28, 2019, 10 pp.

*Primary Examiner* — Farhana A Hoque
(74) *Attorney, Agent, or Firm* — Shumaker & Sieffert, P.A.

(57) ABSTRACT

A driver circuit arrangement for driving a transistor bridge, which includes at least a first half-bridge composed of a low-side transistor and a high-side transistor, is described herein. In accordance with one example of the description, the circuit includes a current source and a detection circuit. The current source is operably coupled to the high-side transistor of the first half-bridge and configured to supply a test current to the first half bridge. The detection circuit is configured to compare a voltage sense signal, which represents the voltage across the high-side transistor of the first half-bridge, with at least one first threshold to detect, dependent on the result of this comparison, whether a short-circuit is present in the first half-bridge.

20 Claims, 5 Drawing Sheets

(56) References Cited

U.S. PATENT DOCUMENTS

2016/0134279 A1\* 5/2016 Sicard .................. H03K 17/687
327/109

\* cited by examiner

TRANSISTOR BRIDGE FAILURE TEST

TECHNICAL FIELD

The invention relates to the field of driver circuits for transistor bridges, particularly to a driver circuit including a short-circuit and/or open circuit (open load) detection.

BACKGROUND

Transistor bridges are commonly used to drive electric loads (including electro-mechanical loads such as electric motors). One simple transistor bridge is a half-bridge, which can be used to drive various types of single-ended loads. So-called H-bridges are usually used to drive loads such as stepper motors. So called three-phase transistor half-bridges can be used to drive a 3-phase electric motor (e.g. a brushless DC motor, BLDC motor). Such three-phase transistor half-bridges are often referred to as three-phase bridges or three-phase inventers and are essentially composed of three transistor half bridges. Transistor bridges are power electronic de-vices which usually are operated by a bridge driver circuit. A bridge driver circuit includes circuitry configured to switch die transistors of the transistor bridge on and off in a defined manner. For example, the bridge driver may be configured to switch die transistors of a three-phase bridge on and off to implement an electronic commutation for a BLDC motor.

In many applications and particularly when driving electric motors it is often desired to detect faulty loads. Therefore, many bridge driver circuits include circuitry for detecting over-currents caused by short-circuits. In this case the transistor bridge needs to be activated so that an over-current can pass through the short-circuited load, before the over-current (and thus the short-circuit) can be detected and a protection mechanism (over-current shut-down) can be triggered. However, such a protection mechanism may be too slow in some application and current spikes may still damage the system (particularly the transistor bridge). Even if potential damage is not an issue, it may be desired to have information about the state of the load before switching on the transistor bridge. Furthermore, an open circuit (open load) detection may be desired in some applications.

SUMMARY

A driver circuit arrangement for driving a transistor bridge, which includes at least a first half-bridge composed of a low-side transistor and a high-side transistor, is described herein. In accordance with one example of the description, the circuit includes a current source and a detection circuit. The current source is operably coupled to the high-side transistor of the first half-bridge and configured to supply a test current to the first half bridge. The detection circuit is configured to compare a voltage sense signal, which represents the voltage across the high-side transistor of the first half-bridge, with at least one first threshold to detect, dependent on the result of this comparison, whether a short-circuit is present in the first half-bridge.

Furthermore, a method for testing a transistor bridge, which includes at least a first half-bridge composed of a low-side transistor and a high-side transistor. In accordance with one example of the description, the method includes supplying a test current to an output node of the first half-bridge and detecting, whether a short-circuit is present in the first half-bridge, by comparing a voltage sense signal, which represents the voltage across the high-side transistor of the first half-bridge, with at least one first threshold.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
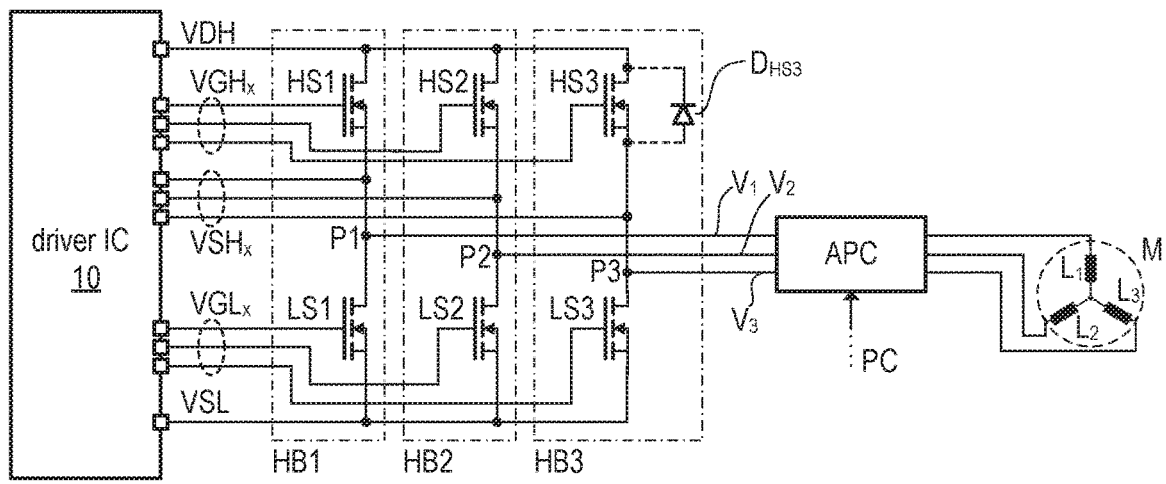
FIG. 1 illustrates a three-phase bridge for driving an electric motor and a driver IC used to drive the three-phase.

FIG. 1 illustrates a 3-phase transistor bridge, which may be used for driving an electric load such as a brushless DC (BLDC) motor. However, various other applications exist, in which other types of loads are driven by a transistor bridge. Furthermore, dependent on the actual application less or more than three phases may be provided. The three-phase transistor bridge, which is depicted in FIG. 1, is also referred to as 3-phase inverter and is composed of three half-bridges HB1, HB2, HB3, each of which is coupled between an upper supply potential VDH and a lower supply potential VSL, which may be ground potential GND. Each one of the of three half-bridges is composed of a high-side transistor and a low-side transistor (high-side transistors HS1, HS2, and HS3 and low-side transistors LS1, LS2, and LS3 for the half-bridges HB1, HB2, and HB3, respectively). In each half-bridge HB1, HB2, HB3 the common circuit node of the high-side-transistor and the low-side transistor is referred to as half-bridge output node or phase node. In the present example the half-bridge output nodes are denoted as P1, P2, and P3, for the half-bridges HB1, HB2, and HB3, respectively. The three output nodes P1, P2, and P3 may be connected to the load, for example, to the stator coils of a BLDC motor. The output voltages at the output nodes are denoted as $V_2$, $V_2$, and $V_3$, respectively.

In the present application the transistors, which compose the half-bridges HB2, HB2, HB3, are metal-oxide-semiconductor field effect transistors (MOSFETs). However, other types of transistors may be applicable such as insulated-gate bipolar transistors (IGBT), bipolar junction transistors (BJT), etc. In the present example, an integrated driver circuit (driver IC 10) is used to control the operation of the transistors bridge. For this purpose, the driver IC is configured to generate driver signals (e.g. a driver voltage) $\text{VGH}_X$ (X={1, 2, 3}) for the high-side transistors HS1, HS2, and HS3, and, $\text{VGL}_X$ (X={1, 2, 3}) for the low-side transistors LS1, LS2, and LS3, in order to switch the transistors on and off. The driver signals $\text{VGH}_X$ and $\text{VGL}_X$ and are supplied to the respective control electrodes of the transistors, that is to the gate electrodes in case of MOSFETs or IGBTs. Usually gate resistors (not shown) are coupled between the driver IC 10 and the control electrodes of the transistors. However, more complex circuitry may be used instead of gate resistors.

In case of n-channel MOSFETs, the source electrodes of the high-side transistors HS1, HS2, and HS3 are connected to the drain electrodes of the low side transistors LS1, LS2, and LS3 at the output nodes P1, P2, and P3, respectively. When using MOSFETs, each transistor has coupled an intrinsic reverse diode in parallel (only shown as reverse diode $D_{HS3}$ for transistor HS3). However, separate reverse diodes may be used when using IGBTs or other types of transistors. The source potentials at the high-side transistors HS1, HS2, and HS3 (which is also the drain-potential of the low side transistors LS1, LS2, and LS3) is denotes as $\text{VSH}_X$ (X={1, 2, 3}), the common drain potential of the high-side transistors HS1, HS2, and HS3 is denoted as VDH, and the common source potential of the low side transistors HS1, HS2, and HS3 is denoted as VSL. Usually, the low side source electrodes are coupled to a lower supply potential (e.g. ground, VSL=0V), whereas the high-side drain electrodes are coupled to an upper supply potential $V_{DD}$ (VDH=$V_{DD}$). The output nodes P1, P2, and P3 are also connected to the driver IC 10 in order to enable sensing of the drain-source voltages VDH–$\text{VSH}_X$ at the high-side transistors HS1, HS2, and HS3, respectively. How such voltage sensing can be utilized to implement a short-circuit detection without the need to switch on any of the transistors is explained further below. FIG. 1 further includes an optional phase disconnector circuit APC, which is configured to disconnect the load from the transistor bridge. In case of a three-phase transistor bridge the phase disconnector circuit APC may include three electronic switches (e.g. a MOSFET), each of which is coupled between one of the phase nodes P1, P2, P3 and the load M. The phase disconnector circuit may be controlled by a control signal PC. If the phase disconnector circuit is activated, the load M (e.g. the electric motor) is actively disconnected from the transistor bridge.

Figure 2:
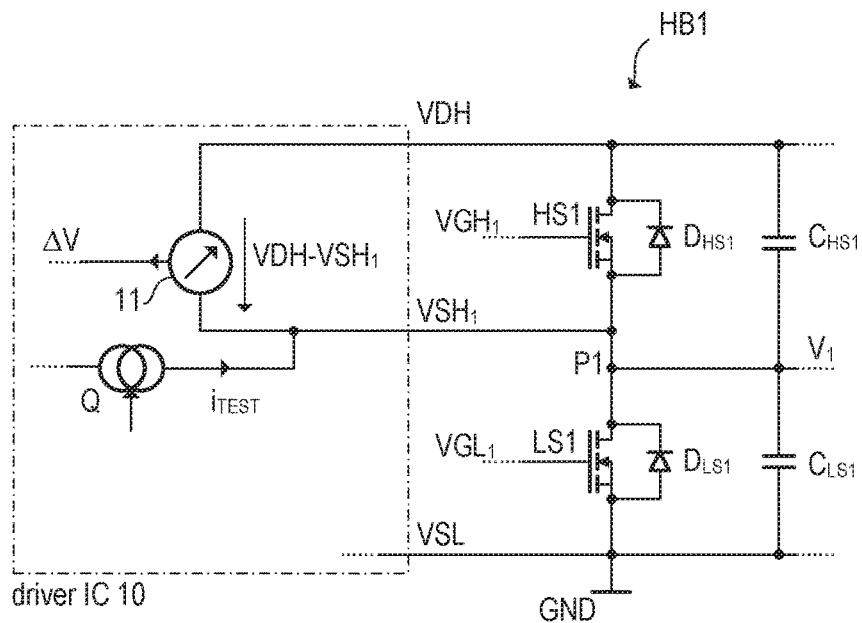
FIG. 2 illustrates one transistor half-bridge and a portion of the driver IC, which implements a short-circuit detection in accordance with one embodiment.
Figure 3A:
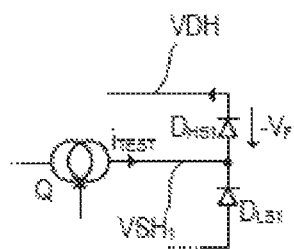
FIGS. 3a-c illustrate the effective circuit of FIG. 2 for a case, in which all transistors are off, and (a) no short-circuit is present, (b) a short-circuit is present at the high-side transistor, and (c) a short-circuit is present at the low-side transistor.

FIG. 2 illustrates one transistor half-bridge (e.g. half-bridge HB1 of the 3-phase inverter shown in FIG. 1) and a portion of the driver IC 10, which implements a short-circuit detection in accordance with one embodiment. The concept described herein can be applied to a single half-bridge (if only one output is needed to drive the load) or to each half-bridge of a H-bridge or a 3-phase bridge. To keep the illustrations simple for the sake of clarity only a single half-bridge HB1 is shown in the embodiments of FIGS. 2, 3, and 4. However, the concept described for one half-bridge can readily be used for two or more half-bridges included, e.g., in a H-bridge or a three-phase bridge. In addition to FIG. 1, the mentioned reverse diodes $D_{HS1}$ and $D_{LS1}$ are shown in FIG. 2 as well as unavoidable parasitic capacitances $C_{HS1}$ and $C_{LS1}$. To test the half-bridge HB1 for short-circuits while the transistors $HS_1$ and $HS_2$ are in a non-conductive state, a test current $i_{TEST}$ is supplied to the output node P1 of the half-bridge. In order to provide the test current $i_{TEST}$ the driver IC 10 includes a current source Q, which is configured to provide the test current at an output pin of the driver IC 10, which is connected to the half-bridge output node P1 The effect of the test current is explained below with reference to FIG. 3. The driver IC 10 further includes a detection circuit 11, which is configured to detect a short-circuit in the half-bridge based on the voltage difference VDH–$\text{VSH}_1$, i.e. based in the voltage across the high-side transistor HS1, wherein "voltage across the transistor" refers to the voltage across the load path (i.e drain-source voltage in case of a MOSFET) of the transistor. In the present example, the current source Q and the detection circuit 11 are integrated in the driver IC 10, which also generates the control signals used to drive the gate electrodes of the transistors HS1, LS1, etc. It is noted, however, that the current source Q and the detection circuit 11 can readily be integrated in a separate integrated circuit or—dependent on the actual implementation—any other integrated circuit included in the overall system (e.g. in a supply IC, a diagnosis IC, etc.). Furthermore, the circuitry representing the detection circuit 11 and the current source Q may also be distributed across two or more integrated circuits.

When the transistors HS1 and LS1 of the half-bridge are switched off, the test current $i_{TEST}$ affects the potential of the output node P1 which is the same as the source potential $\text{VSH}_1$ of the high-side transistor HS1. The effect of the test current $i_{TEST}$ on the source $\text{VSH}_1$ potential and thus on the drain-source voltage $\Delta V=\text{VDH}-\text{VSH}_1$ is illustrated by the equivalent circuits of FIG. 3, in which the transistors HS1 and LS1 are omitted as they are non-conducting and thus have no effect. In the case shown in FIG. 3*a* no short-circuit is present in the half-bridge. There-fore the test current $i_{TEST}$ passes the reverse diode $D_{HS1}$ of the high-side transistor, whereas the reverse diode $D_{LS1}$ of the low-side transistor is blocking. Thus, the test current $i_{TEST}$ causes the potential $\text{VSH}_1$ (high-side source potential) at the half-bridge output node P1 to rise above the supply voltage VDH (thereby charging the parasitic capacitors $C_{HS1}$ and $C_{LS1}$, see FIG. 2) until the drain-source voltage VDH–$\text{VSH}_1$ of the reaches the inverse forward voltage $V_F$ of the diode $D_{HS1}$, which is approximately 0.7 volts. As can be seen from FIG. 3*a*, the absence of a short-circuit can be detected by assessing whether and how far the half-bridge output potential $\text{VSH}_1$ rises above the supply potential VDH (equal to $V_{DD}$). In a fault-free half bridge the half-bridge output potential $\text{VSH}_1$ will rise up to approximately VDH+0.7V, which is equivalent to the high-side drain-source voltage VDH–$\text{VSH}_1$ falling to approximately –0.7V (i.e. –$V_F$).

Figure 3B:
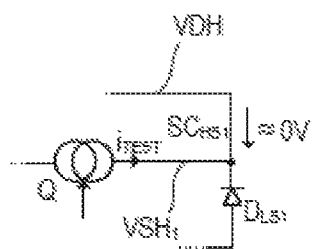
Figure 4:
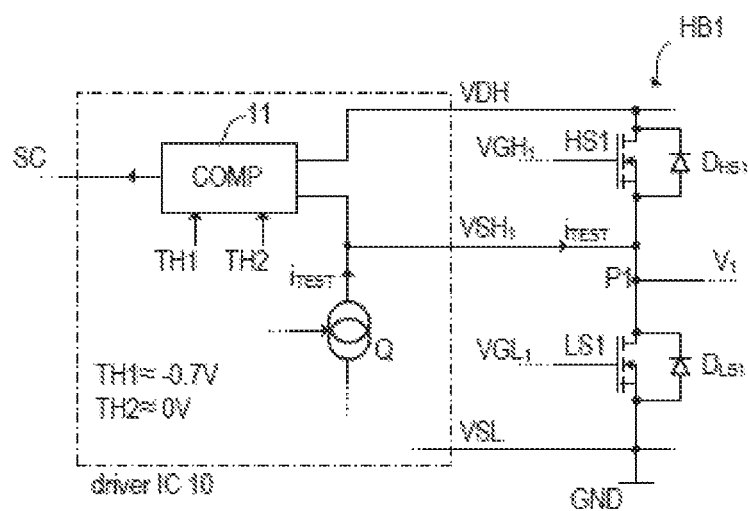
FIG. 4 illustrates one transistor half-bridge and a portion of the driver IC, which implements a short-circuit detection in accordance with another embodiment.

FIG. 3*b* illustrates the case, in which the high-side transistor HS1 and therefore also the reverse diode $D_{HS1}$ are short-circuited (short-circuit $SC_{HS1}$), for example, due to a malfunction of the load connected to the half bridge. In this case, the potential $\text{VSH}_1$ at the half-bridge output node P1 is approximately equal to the upper supply potential VDH (high-side drain potential), whereas the reverse diode $D_{LS1}$ of the low-side transistor is, again, blocking. Due to the short-circuit $SC_{HS1}$, the potential $\text{VSH}_{1\ is}$ not able to rise significantly above the supply potential VDH, and the drain-source voltage VDH–$\text{VSH}_1$ is approximately zero (VDH–$\text{VSH}_1 \approx 0V$).

Figure 3C:
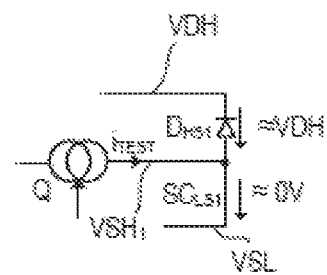

FIG. 3*c* illustrates the case, in which the low-side transistor LS1 and therefore also the reverse diode $D_{LS1}$ are short-circuited (short-circuit $SC_{LS1}$). In this case, the potential $\text{VSH}_1$ at the half-bridge output node P1 is approximately equal to the lower supply potential VSL (low-side source potential, e.g. ground potential), which causes a reverse biasing of the reverse diode $D_{HS1}$ of the high-side transistor HS1. Due to the short-circuit $SC_{LS1}$, the potential $VSH_1$ drops approximately to the low-side source-potential VSL, and the drain-source voltage $VDH-VSH_1$ rises up to significant positive values ($VDH-VSH_1>0V$).

FIG. 4 illustrates another embodiment, wherein the detection circuit 11 is shown in more detail as compared to the example of FIG. 2. Similar as in the previous examples, FIG. 4 shows a current source Q that generates a test current $i_{TEST}$, which is supplied to the output node P1 of the half-bridge in order to test the half-bridge HB1 for short-circuits while the transistors $HS_1$ and $HS_2$ are in a non-conductive (off) state. The test current $i_{TEST}$ is provided at an output pin of the driver IC 10, which is connected to the half-bridge output node P1. The driver IC 10 further includes a detection circuit 11, which is in the present example a comparator circuit (labelled COMP in FIG. 4). Accordingly, the detection circuit 11 is supplied with the voltage drop across the high-side transistor HS1 and is configured to detect a short-circuit in the half-bridge based on this voltage drop (i.e. the voltage difference $VDH-VSH_1$).

For detection short-circuits the comparator circuit COMP is configured to compare the voltage drop $VDH-VSH_1$ across the high-side transistor HS1 with two threshold values TH1 and TH2 in order to distinguish the three cases discussed above with reference to FIGS. 3a-c. Accordingly, the first threshold can be chosen to be approximately equal to (or slightly higher than) the negative forward voltage of the reverse diode $D_{HS1}$ of the high-side transistor HS1. That is, TH1 may be set to approximately $-0.7$ V or $-0.6$ V. The second threshold value TH2 may be set to approximately 0 volts or slightly higher, e.g. TH2=0V or TH2=0.1 V. The comparator circuit COMP compares the voltage drop $VDH-VSH_1$ with the first threshold TH1. If the inequality $(VDH-VSH_1) \leq TH1$ is true, then the source potential $VSH_1$ of the high-side transistor HS1 exceeds the corresponding drain potential VDH by at least the reverse diode forward voltage $V_F$ (if $TH1=-V_F$). This case corresponds to the case shown in FIG. 3a and indicates that no short-circuit is resent. If the inequality $(VDH-VSH_1) \leq TH1$ is false and the voltage drop $VDH-VSH_1$ is lower than the second threshold TH2 ($VDH-VSH_1<TH2$ indicating that the voltage drop is close to zero but not lower that $-V_F$), the comparator circuit COMP indicates a short-circuit of the high-side transistor HS1, which corresponds to the case discussed with reference to FIG. 3b. If also the inequality $VDH-VSH_1<TH2$ is false, then the something is pulling the source potential of the high-side-transistor HS1 towards the lower supply potential (e.g. ground potential), which corresponds to the case discussed with reference to FIG. 3C. Accordingly, the comparator may signal a short-circuit of the low side transistor LS1. The result of the evaluation of the above-mentioned inequalities may be signaled by any suitable comparator output signal SC. The comparator used in the detection circuit 11 may be implemented in any conventional manner. For example, the comparator may be an analog comparator configured to compare analog signals. It may, however, also be implemented digitally using at least one analog-digital converter and digital evaluation of the digitized signals.

Figure 5:
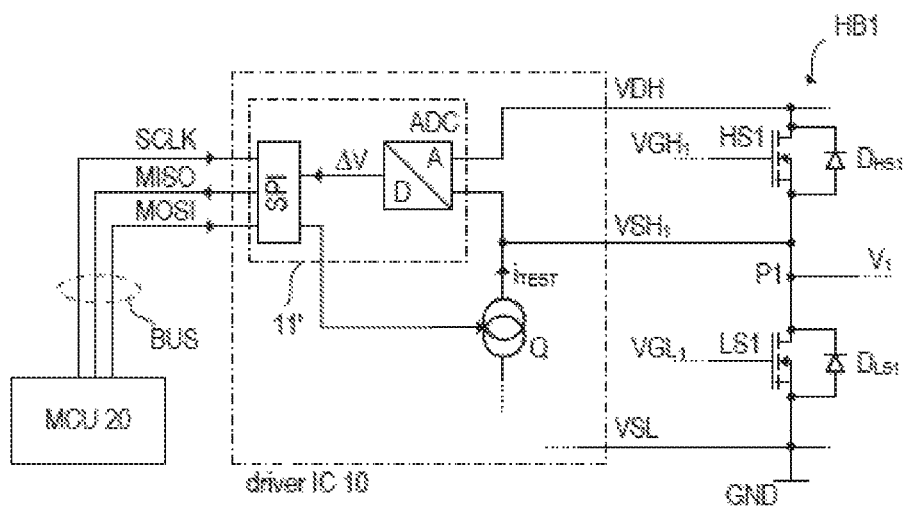
FIG. 5 illustrates one transistor half-bridge and a portion of the driver IC, which implements a short-circuit detection in accordance with a further embodiment, in which the driver IC is coupled to a controller via a digital bus.

The detection circuit is not necessarily implemented in the driver IC 10 only. In the example of FIG. 5 a portion of the above-explained function of the detection circuit is "outsourced" to an external controller unit 20, which may communicate with the driver IC 10 via, for example, a communication bus (see bus lines labelled BUS in FIG. 5). In the example of FIG. 5 the external controller unit 20 is a micro-controller unit labelled MCU. The driver IC further includes a bus interface to enable communication with the MCU 20. Any known bus standard may be used for operating the communication bus. In the present example the standardized SPI (Serial Peripheral Interface) bus is used. However, other bus standards, such as the I2C (inter-integrated circuit) bus may be used instead. In the example of FIG. 5, the detection circuit 11' includes an SPI bus interface and an analog-to-digital converter ADC, which is configured to digitize the voltage drop $VDH-VSH_1$ across the high-side transistor HS1 and to provide a respective digital signal $\Delta V$ (digital voltage sense signal) representing the mentioned voltage drop $VDH-VSH_1$. The digital voltage sense signal $\Delta V$ is communicated to the MCU 20 via the communication bus BUS, and the MCU 20 takes over comparing function of the comparator circuit in the previous example of FIG. 4, In this case, the threshold values TH1 and TH2 may be stored in the MCU 20 as digital values and the comparing function may be implemented digitally using appropriate software instructions. Additionally or alternatively to the mentioned comparing function (i.e. evaluating the inequalities $VDH-VSH_1<TH1$ and $VDH-VSH_1<TH2$) the MCU 20 may use more complex evaluation algorithms to detect short-circuits in the half-bridge HB1 based on voltage difference $VDH-VSH_1$ across the high-side transistor HS1. Generally the detection circuit (partially implemented in the driver IC 10 (circuit 11') and partially in the MCU 20) may evaluate a function $f(\Delta V)$, which may assume three different values dependent on the voltage drop $\Delta V$, wherein a first value (e.g. 0) indicates that no short-circuit is present, a second value (e.g. 1) indicates that the high-side transistor is short-circuited, and a third value (e.g. 2) indicates that the low-side transistor is short-circuited.

Figure 6:
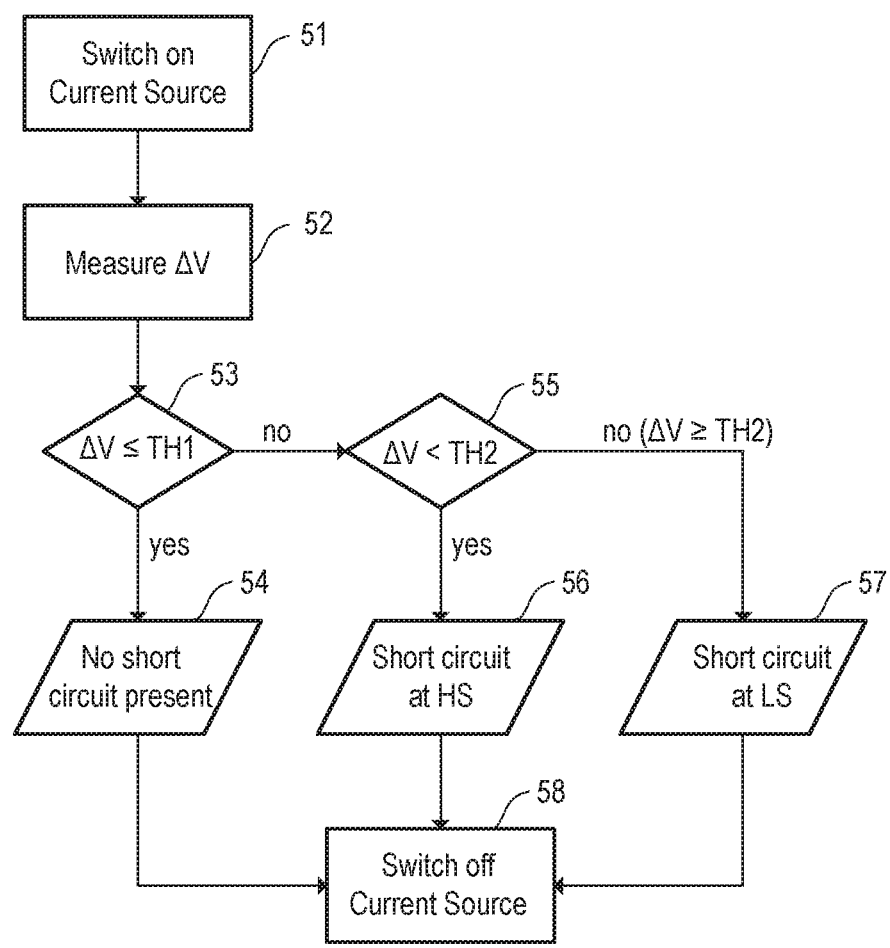
FIG. 6 is a flow-chart illustrating an example of a method for detecting short-circuits implemented by the embodiments described herein.

The flow chart of FIG. 6 summarized the function implemented by the detection circuit 11 (at least partially integrated in the driver IC 10) and the current source Q. Accordingly, the current source Q is switched on and injects a test current $i_{TEST}$ into the output node of a transistor half-bridge (step 51, see also FIG. 5, output node P1). Subsequently, the voltage difference $VDH-VSH_1$ is measured (step 52). Such measurement may either be accomplished by sensing the voltage difference $VDH-VSH_1$ and supplying the sensed voltage to a comparator circuit (see comparator COMP in FIG. 4) or by sensing the voltage difference $VDH-VSH_1$ and digitizing the sensed voltage to provide a digital signal (see analog-to-digital converter ADC in FIG. 5). Either in the analog domain (FIG. 4) or in the digital domain (FIG. 5) the sensed voltage $\Delta V=VDH-VSH_1$ is used to evaluate, whether the sensed voltage $\Delta V$ fulfills a first condition, which is, in the present example, the inequality $\Delta V \leq TH1$ (step 53), wherein $TH1 \approx V_F$ as discussed above with reference to FIG. 4. If the first condition is fulfilled then a fault-free half-bridge (no-short-circuit present) is detected (step 54) and the current source Q is switched off (step 58).

If the first condition is not fulfilled it is tested, whether the sensed voltage $\Delta V$ fulfills a second condition, which is, in the present example, the inequality $\Delta V<TH2$ (step 55), wherein $TH1 \approx 0.1V$ as discussed above with reference to FIG. 4. In essence, it is tested whether the sensed voltage is approximately zero. If the second condition is fulfilled then a short-circuit is detected at the high-side semiconductor switch (step 56). If the second condition is not fulfilled then a short-circuit is detected at the low-side semiconductor switch (step 57). In either case the current source Q is switched off (step 58) after the detection. The short-circuit detection as illustrated by the flow-chart of FIG. 6 may be repeated for each half-bridge of the transistor bridge. For example, in case of a H-bridge the test according to FIG. 5 may be done for both half-bridges of the H-bridge. In case of a three-phase bridge, the test according to FIG. 5 may be done for all three half-bridges of the three-phase bridge.

Figure 7:
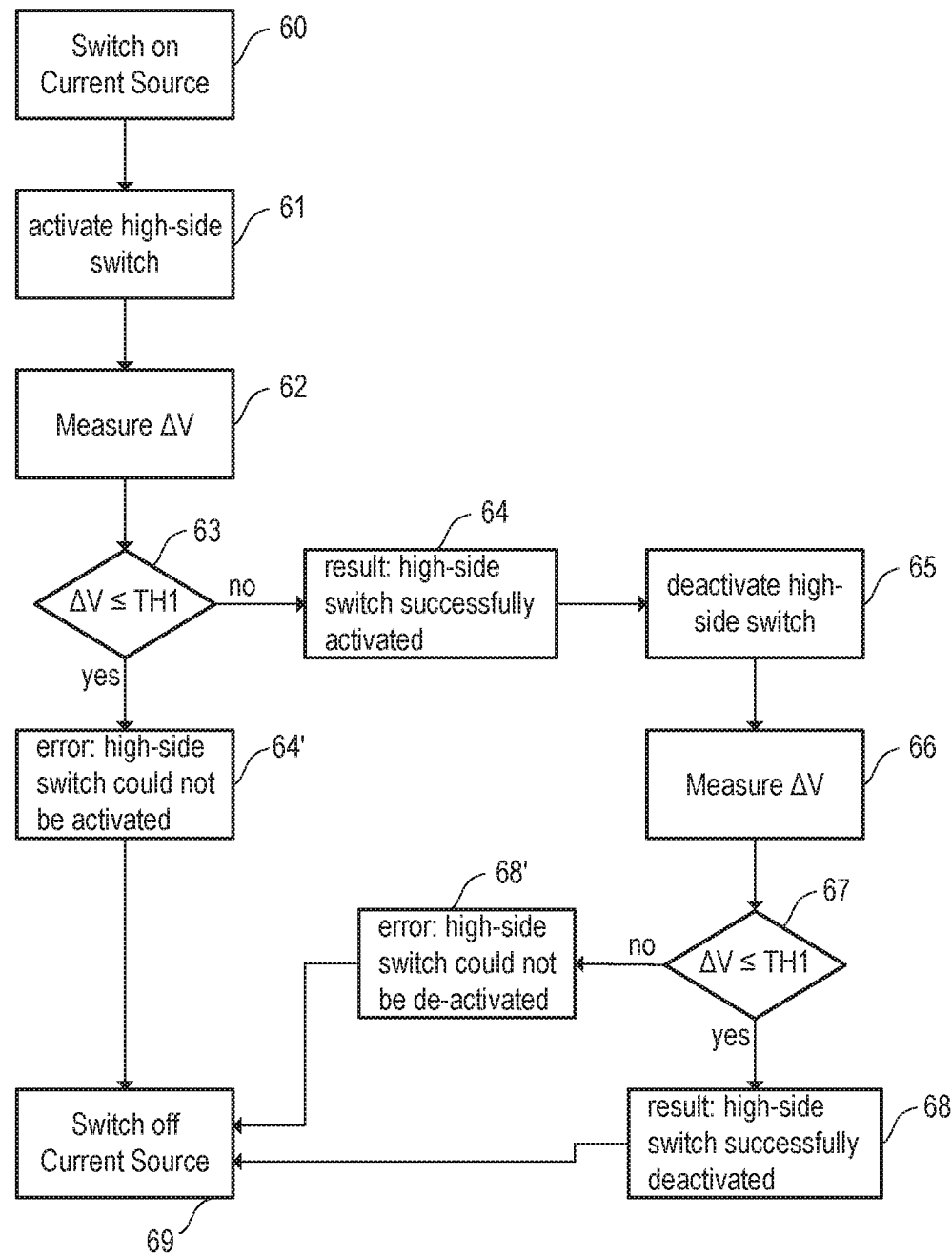
FIG. 7 is a flow-chart illustrating an example of a method for detecting whether the switches of a half-bridge can be individually switched on and off.

FIG. 7 illustrates a further test, which makes use of one of the embodiments described herein with reference to FIGS. 1 to 5. This test allows to easily detect, whether both switches of a specific half-bridge (high-side switch and low-side switch) can be activated (switched on) and subsequently deactivated (switched off). This test is useful for some applications, as transistors may not only fail as short-circuits. Other types of failures may comprise the switch being unable to switch on or an activated switch not being unable to switch off. The test illustrated in the example of FIG. 7 will usually be made after the short-circuit detection, which has been explained above.

If the current source Q (see FIGS. 2 to 5) is off, it is switched on to activate the test current $i_{TEST}$ (step 60). If the current source Q is already on, step 60 can be omitted. Subsequently, the high-side switch HS1 of a specific half-bridge (e.g. half-bridge HB1) is activated (i.e. switched on) by generating an appropriate gate signal $VGH_1$ (step 61). The test, whether the high-side switch in actually on, is accomplished by measuring the voltage drop $\Delta V$ across the load current path of the high-side switch HS1 (step 62), i.e. the drain source voltage $VDH-VSH_1$, and comparing whether the voltage drop $\Delta V$ is below a negative threshold value TH1 (step 63). Steps 62 and 63 are essentially the same as steps 52 and 53 of the short-circuit detection (see FIG. 6), wherein the negative threshold value is based on the forward voltage $V_F$ of the reverse diode $D_{HS1}$ of the high-side switch HS1. For example, when $V_F \approx 0.7$ V, the threshold value TH1 may be approximately −0.7 V or slightly higher (e.g. TH1≈0.6 V or TH1≈0.5 V). If the high-side switch HS1 has been successfully activated, the comparison of step 63 will yield the same result as if the high-side switch HS1 would be short-circuited. That is, the source potential $VSH_1$ of the high-side switch HS1 is approximately the same as the drain potential SDH of the high-side switch HS1, and thus the difference $\Delta V = VDH-VSH_1$ will be approximately zero. Consequently, evaluating the inequality (step 63) $\Delta V \leq TH1$ results in a "no" ($\Delta V$ is closer to zero than TH1), which indicates that the high-side switch HS1 has been successfully activated (FIG. 7, box 64).

Even if the high-side switch HS1 has been successfully activated, it may happen that the switch fails and cannot be deactivated (switched off) any more. To test this type of failure, the method of FIG. 7 continues at step 65, in which the high-side switch HS1 is deactivated by applying an appropriate gate signal $VGH_1$. Then, the voltage drop $\Delta V$ across the load current path of the high-side switch HS1 is again measured (step 66) and compared with the threshold TH1 (step 67). If the high-side switch HS1 has been successfully deactivated the test current will pass the reverse diode $D_{HS1}$ of the high-side switch HS1 as indicated in FIG. 3a. As a result, the source voltage $VSH_1$ will rise above the drain voltage VDH and the difference $\Delta V = VDH-VSH_1$ will fall to approximately $-V_F$ (e.g. approximately −0.7 V). Therefore, if the evaluation of the inequality (step 67) $\Delta V \leq TH1$ results in a "yes" the high-side switch HS1 has been successfully deactivated (FIG. 7, box 68).

If, in step 63, the evaluation of the inequality $\Delta V \leq TH1$ results in a "yes", an error is indicated (FIG. 7, box 64') as the high-side switch did not switch on properly and does not provide a low-resistive current path between its drain electrode and its source electrode. Similarly, if, in step 67, the evaluation of the inequality $\Delta V < TH1$ results in a "no", an error is indicated (FIG. 7, box 68') as the high-side switch did not switch off properly and still provides a low-resistive current path between its drain electrode and its source electrode, although it should be off. The test method of FIG. 7 may be repeated for each high-side switch HS1, HS2, HS3 and each low-side switch LS1, LS2, LS3 of each half-bridge HB1, HB2, HB3. If a low-side switch is tested instead of a high side switch, $\Delta V$ will be positive and approximately equal to VDH−VSL. However, as the threshold TH1 is negative, this does not change anything and the method may be used to test high-side and low-side switches without modification.

Figure 8:
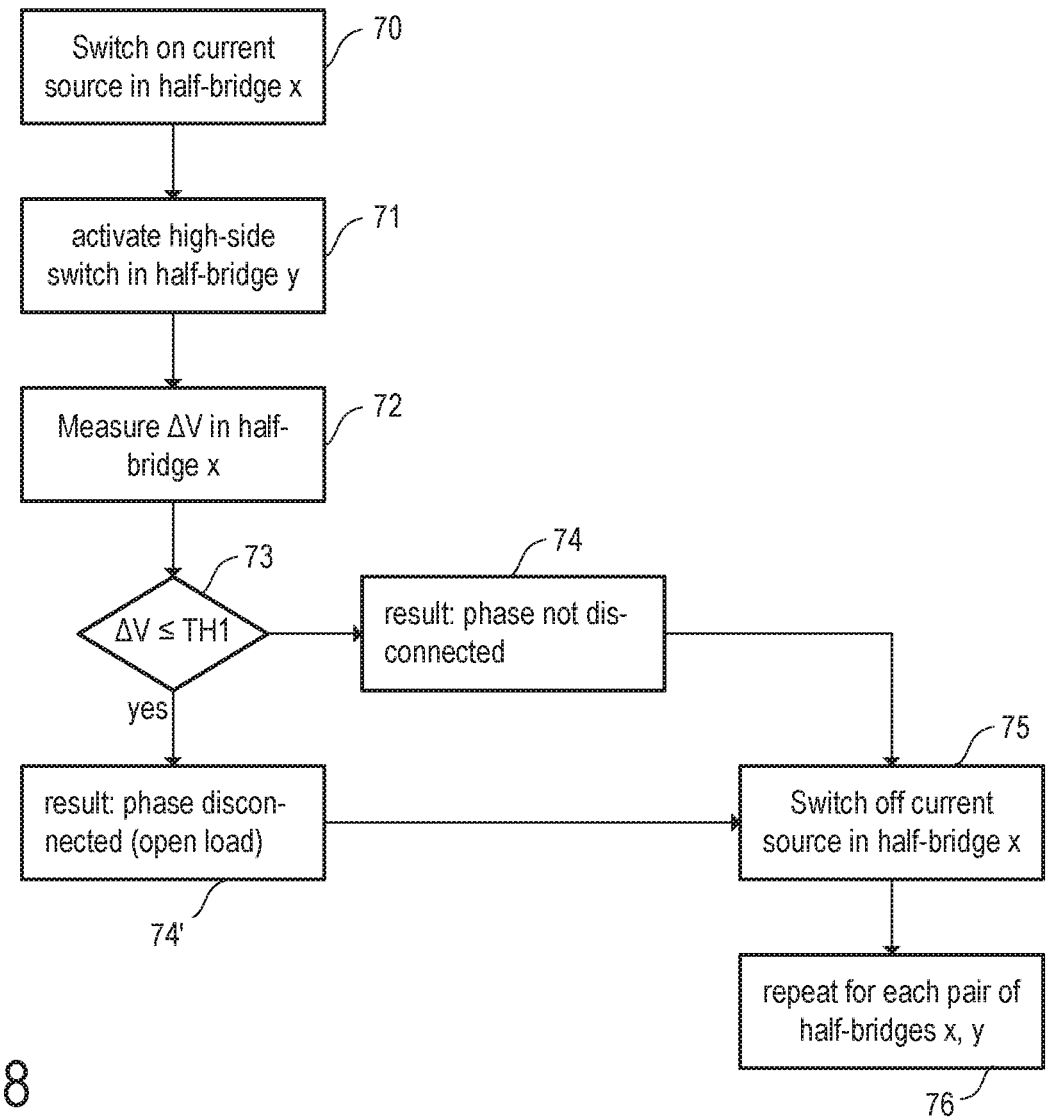
FIG. 8 is a flow-chart illustrating an example of a method for detecting an open load for H-bridges or three-phase transistor bridges.

The embodiments described herein with respect to one of the FIGS. 1 to 5 allow for an additional test that is illustrated by the flow chart of FIG. 8. FIG. 8 illustrates one exemplary detection method to detect whether the load M (see FIG. 1) is actually connected to the half-bridge output nodes P1, P2, P3 of a three-phase transistor bridge (i.e. to test for an open-circuit condition). Alternatively, the method may also be used in an H-bridge composed of only two half-bridges. In FIG. 8, the parameters x and y stand for any pair of half-bridges, e.g. x=HB1 and y=HB2. Accordingly, the current source Q is switched on in step 70 to inject a test current $i_{TEST}$ in half-bridge x (e.g. half-bridge HB1). Subsequently, in step 71 the high-side switch in half-bridge y is activated (e.g. high-side switch HS2 in half-bridge HB2). As a result, the voltage difference $\Delta V = VDH-VSH_2$ will be approximately zero in half-bridge y, and, if the load is connected between the output nodes of the two half-bridges x, y (e.g. nodes P1 and P2), the voltage difference $\Delta V = VDH-VSH_1$ will be also zero in the other half-bridge x due to the low-resistive current path provided by the load (e.g. motor M in FIG. 1). So, if the voltage drop $\Delta V$ is measured in half-bridge x (step 72) and compared with threshold TH1 as in the previous methods of FIGS. 6 and 7 (step 73), an open load can be detected (FIG. 8, box 74'), when the evaluation of the inequality $\Delta V < TH1$ results in a "yes" (i.e. if closing the switch in the half-bridge y has no effect in half-bridge x). When the evaluation of the inequality $\Delta V < TH1$ results in a "no" the load is properly connected. Finally the current source Q can be switched off again (step 75). The method shown in FIG. 8 may be repeated for another pair of half-bridges, e.g. x=HB2 and y=HB3.

It is understood, that the method of FIG. 8 also is applicable for H-bridges which only include two half-bridges. A detected open-circuit condition may also be an indication that the phase disconnectors APC (see FIG. 1) do not operate properly.

The following examples set forth some combinations of features that may be used.

EXAMPLE 1

A circuit arrangement for testing a transistor bridge, which includes at least a first half-bridge composed of a low-side transistor and a high-side transistor; the circuit comprises:

a current source that is operably coupled to the high-side transistor of the first half-bridge and configured to supply a test current to the first half bridge;

a detection circuit, which is configured to compare a voltage sense signal, which represents the voltage across the high-side transistor of the first half-bridge, with at least one first threshold and to detect, dependent on the result of this comparison, whether a short-circuit is present in the first half-bridge.

EXAMPLE 2

The circuit arrangement of example 1,
wherein a first load terminal of the high-side transistor is operably connected to a first supply potential and a second load terminal of the high-side transistor is connected to a first output node; and
wherein the current source is configured to supply the test current to the first output node.

EXAMPLE 3

The circuit arrangement of any combination of examples 1-2,
wherein detection circuit includes an analog-to-digital converter that is configured to provide a digital signal as voltage sense signal.

EXAMPLE 4

The circuit arrangement of any combination of examples 1-3,
wherein the detection circuit includes a digital comparator configured to detect whether the voltage sense signal is below or above the first threshold.

EXAMPLE 5

The circuit arrangement of any combination of examples 1-4,
wherein the voltage sense signal is an analog signal tapped at the high-side transistor of the first half-bridge, and
wherein the detection circuit includes a comparator circuit receiving the voltage sense signal.

EXAMPLE 6

The circuit arrangement of any combination of examples 1-5,
wherein the detection circuit is configured to compare the voltage sense signal with a first threshold and a second threshold, and
wherein a short-circuit at the high-side transistor is detected, when the voltage sense signal is higher than the first threshold but lower than the second threshold, and a short-circuit at the low-side transistor is detected when the voltage sense signal is higher than the second threshold.

EXAMPLE 7

The circuit of any combination of example 6, wherein the first threshold is between the negative forward voltage of a reverse diode coupled parallel to the high side transistor and zero.

EXAMPLE 8

The circuit of example 6 or 7, wherein the second threshold is higher than or equal to zero.

EXAMPLE 9

A method for testing a transistor bridge, which includes at least a first half-bridge composed of a low-side transistor and a high-side transistor; the method comprises:
supplying a test current to an output node of the first half-bridge; and
detecting, whether a short-circuit is present in the first half-bridge, by comparing a voltage sense signal, which represents the voltage across the high-side transistor of the first half-bridge, with at least one first threshold.

EXAMPLE 10

The method of example 9, wherein detecting whether a short-circuit is present in the first half-bridge comprises:
digitizing the voltage sense signal to provide a digital signal; and
comparing the digital signal with the at least one first threshold, the first threshold being a digital number.

EXAMPLE 11

The method of any combination of examples 9-10, wherein detecting whether a short-circuit is present in the first half-bridge comprises:
tapping the voltage sense signal at the high-side transistor; and
using an analog comparator to determine whether the voltage sense signal exceeds the at least one first threshold.

EXAMPLE 12

The method of any combination of examples 9-11, wherein detecting, whether a short-circuit is present in the first half-bridge, comprises:
comparing the voltage sense signal with the first threshold and a second threshold;
signaling a short-circuit of the high-side transistor, when the voltage sense signal is higher than the first threshold but lower than the second threshold, and
signaling a short-circuit of the low-side transistor, when the voltage sense signal is higher than the second threshold.

EXAMPLE 13

The method of any combination of examples 9-12, wherein the first threshold is between the negative forward voltage of a reverse diode coupled parallel to the high side transistor and zero.

EXAMPLE 14

The method of example 12 or 13, wherein the second threshold is higher than or equal to zero.

EXAMPLE 15

A method for testing a transistor bridge, which includes at least a first half-bridge composed of a low-side transistor and a high-side transistor; the method comprises:
supplying a test current to an output node of the first half-bridge;
activating a first switch of the first half-bridge; and
verifying, whether the first switch has been actually activated, by comparing a voltage sense signal, which represents the voltage across the high-side transistor of the first half-bridge, with at least one first threshold.

EXAMPLE 16

The method of example 15, the method further comprising:
activating the first switch of the first half-bridge; and
verifying, whether the first switch has been actually deactivated, by comparing the voltage sense signal with the at least one first threshold.

EXAMPLE 17

The method of any combination of examples 15-16, the method further comprising:
activating a second switch of the first half-bridge;
verifying, whether the second switch has been actually activated, by comparing the voltage sense signal with a second threshold;
deactivating the second switch of the first half-bridge; and
verifying, whether the second switch has been actually de-activated, by comparing the voltage sense signal with the second threshold.

EXAMPLE 18

A method for testing a transistor bridge, which includes at least a first half-bridge and a second half bridge, each half-bridge being composed of a low-side transistor and a high-side transistor; the method comprising:
supplying a test current to an output node of the first half-bridge;
activating a first switch of the second half-bridge; and
verifying, whether the load is properly connected between the output nodes of the first half-bridge and the second half-bridge, by comparing a voltage sense signal, which represents the voltage across the high-side transistor of the first half-bridge, with at least one first threshold.

EXAMPLE 19

The method of example 18, wherein the transistor bridge includes a third half-bridge; the method further comprising:
activating a first switch of the third half-bridge; and
verifying, whether the load is properly connected between the output nodes of the first half-bridge and the third half-bridge, by comparing the voltage sense signal, which represents the voltage across the high-side transistor of the first half-bridge, with at least one second threshold.

EXAMPLE 20

The method of any combination of examples 18-19, the method further comprising:
supplying the test current to an output node of the second half-bridge;
activating a first switch of the third half-bridge; and
verifying, whether the load is properly connected between the output nodes of the second half-bridge and the third half-bridge, by comparing a further voltage sense signal, which represents the voltage across the high-side transistor of the second half-bridge, with at least one third threshold.

EXAMPLE 21

The method of any combination of examples 18-20, wherein the first, the second and the third thresholds are equal.

EXAMPLE 22

The circuit of any combination of examples 1-8, the circuit being integrated in a gate driver chip including gate driver circuitry for driving the high- and low-side transistors of the transistor bridge.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:

1. A circuit arrangement for testing a transistor bridge, which includes at least a first half-bridge including a low-side transistor and a high-side transistor, the circuit arrangement comprising:
a current source operably coupled to the high-side transistor of the first half-bridge and configured to supply a test current to a first output node of the first half-bridge; and
a detection circuit configured to compare a voltage sense signal, which represents a voltage across the high-side transistor of the first half-bridge, with at least one first threshold and to detect, dependent on the result of the comparison, whether a short-circuit is present in the first half-bridge,
wherein a first load terminal of the high-side transistor is operably connected to a first supply potential,
wherein a second load terminal of the high-side transistor is connected to the first output node, and
wherein a load terminal of the low-side transistor is connected to the first output node.

2. The circuit arrangement of claim 1, wherein the detection circuit includes an analog-to-digital converter configured to provide a digital signal as the voltage sense signal.

3. The circuit arrangement of claim 2, wherein the detection circuit includes a digital comparator configured to detect whether the voltage sense signal is below or above the at least one first threshold.

4. The circuit arrangement of claim 1,
wherein the voltage sense signal is an analog signal tapped at the high-side transistor of the first half-bridge, and
wherein the detection circuit includes a comparator circuit configured to receive the voltage sense signal.

5. The circuit arrangement of claim 1,
wherein the detection circuit is configured to compare the voltage sense signal with the at least one first threshold by comparing the voltage sense signal with a first threshold and a second threshold, and
wherein the detection circuit is configured to detect that a short-circuit is present at the high-side transistor, when the voltage sense signal is higher than the first threshold but lower than the second threshold, and to detect that a short-circuit is present at the low-side transistor when the voltage sense signal is higher than the second threshold.

6. The circuit arrangement of claim 5, wherein a value of the first threshold is between a value of a negative forward voltage of a reverse diode coupled in parallel to the high-side transistor and zero.

7. The circuit arrangement of claim 6, wherein a value of the second threshold is higher than or equal to zero.

8. The circuit arrangement of claim 1, wherein the circuit arrangement is integrated in a gate driver chip including gate driver circuitry for driving the high-side transistor and the low-side transistor of the transistor bridge.

9. The circuit arrangement of claim 1, wherein the detection circuit is configured to receive the voltage sense signal while the current source is supplying the test current to the first output node of the first half-bridge.

10. A method for testing a transistor bridge, which includes at least a first half-bridge including a low-side transistor and a high-side transistor, the method comprising:
supplying a test current to an output node of the first half-bridge; and
detecting whether a short-circuit is present in the first half-bridge by comparing a voltage sense signal, which represents a voltage across the high-side transistor of the first half-bridge, with at least one first threshold,
wherein a first load terminal of the high-side transistor is operably connected to a first supply potential,
wherein a second load terminal of the high-side transistor is connected to the output node, and
wherein a load terminal of the low-side transistor is connected to the output node.

11. The method of claim 10, wherein detecting whether the short-circuit is present in the first half-bridge comprises:
digitizing the voltage sense signal to provide a digital signal; and
comparing the digital signal with the at least one first threshold, the at least one first threshold being a digital number.

12. The method of claim 10, wherein detecting whether the short-circuit is present in the first half-bridge comprises:
tapping the voltage sense signal at the high-side transistor; and
using an analog comparator to determine whether the voltage sense signal exceeds the at least one first threshold.

13. The method of claim 10, wherein detecting whether the short-circuit is present in the first half-bridge comprises:
comparing the voltage sense signal with the at least one first threshold by comparing the voltage sense signal with a first threshold and a second threshold;
signaling a short-circuit of the high-side transistor, when the voltage sense signal is higher than the first threshold but lower than the second threshold, and
signaling a short-circuit of the low-side transistor, when the voltage sense signal is higher than the second threshold.

14. The method of claim 13, wherein a value of the first threshold is between a value of a negative forward voltage of a reverse diode coupled in parallel to the high-side transistor and zero.

15. The method of claim 14, wherein a value of the second threshold is higher than or equal to zero.

16. A circuit arrangement for testing a transistor bridge, which includes at least a first half-bridge including a low-side transistor and a high-side transistor, the circuit arrangement comprising:
a current source operably coupled to the high-side transistor of the first half-bridge and configured to supply a test current to the first half-bridge; and
a detection circuit configured to:
compare a voltage sense signal, which represents a voltage across the high-side transistor of the first half-bridge, with at least one first threshold by comparing the voltage sense signal with a first threshold and a second threshold;
detect, dependent on the result of the comparison, that a short-circuit is present at the high-side transistor, when the voltage sense signal is higher than the first threshold but lower than the second threshold; and
detect, dependent on the result of the comparison, that a short-circuit is present at the low-side transistor when the voltage sense signal is higher than the second threshold.

17. The circuit arrangement of claim 16, wherein a value of the first threshold is between a value of a negative forward voltage of a reverse diode coupled in parallel to the high-side transistor and zero.

18. The circuit arrangement of claim 17, wherein a value of the second threshold is higher than or equal to zero.

19. The circuit arrangement of claim 16,
wherein the detection circuit includes an analog-to-digital converter configured to provide a digital signal as the voltage sense signal, and
wherein the detection circuit includes a digital comparator configured to detect whether the voltage sense signal is below or above the at least one first threshold.

20. The circuit arrangement of claim 16,
wherein the voltage sense signal is an analog signal tapped at the high-side transistor of the first half-bridge, and
wherein the detection circuit includes a comparator circuit configured to receive the voltage sense signal.

* * * * *